(12) United States Patent
Lacroix

(10) Patent No.: US 9,397,623 B1
(45) Date of Patent: Jul. 19, 2016

(54) DUAL PATH DOUBLE ZERO CONTINUOUS TIME LINEAR EQUALIZER

(71) Applicant: Huawei Technologies Co., Ltd., Guangdong (CN)

(72) Inventor: Marc-Andre Lacroix, Ottawa (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/633,866

(22) Filed: Feb. 27, 2015

(51) Int. Cl.
*H03H 7/30* (2006.01)
*H03F 3/45* (2006.01)
*H03F 3/193* (2006.01)
*H04L 25/03* (2006.01)

(52) U.S. Cl.
CPC ............ *H03F 3/45179* (2013.01); *H03F 3/193* (2013.01); *H04L 25/03885* (2013.01); *H03F 2203/45112* (2013.01); *H03F 2203/45222* (2013.01)

(58) Field of Classification Search
CPC .................... H04L 25/03038; H04L 25/03057
USPC .......................................... 375/232, 229, 230
See application file for complete search history.

(56) References Cited

U.S. PATENT DOCUMENTS

| | | | |
|---|---|---|---|
| 7,978,011 B1 * | 7/2011 | Stevenson | H03F 1/22 330/283 |
| 8,228,976 B2 | 7/2012 | Hsiao et al. | |
| 8,274,326 B2 * | 9/2012 | Boecker | H03F 1/301 327/559 |
| 8,761,237 B2 * | 6/2014 | Aziz | H04L 25/03057 375/229 |
| 8,810,319 B1 * | 8/2014 | Chan | H03F 1/42 330/253 |
| 8,872,541 B2 | 10/2014 | Mandal | |
| 2008/0101450 A1 * | 5/2008 | Wu | H04L 7/0054 375/232 |
| 2009/0195304 A1 * | 8/2009 | Bankman | H03H 11/0422 327/552 |
| 2013/0077669 A1 * | 3/2013 | Malipatil | H04L 25/03019 375/233 |
| 2013/0114663 A1 | 5/2013 | Ding et al. | |
| 2014/0185661 A1 | 7/2014 | Chang et al. | |

FOREIGN PATENT DOCUMENTS

| CN | 103095618 A | 5/2013 |
|---|---|---|
| CN | 103379063 A | 10/2013 |

* cited by examiner

*Primary Examiner* — Helene Tayong
(74) *Attorney, Agent, or Firm* — Slater Matsil, LLP

(57) ABSTRACT

A transadmittance amplifier stage is coupled to a transimpedance amplifier stage to form a continuous time linear equalizer. The transadmittance amplifier stage has first and second gain paths and is configured to input a first signal and output a second signal. The first gain path is configured to provide a DC gain recovery and a first high frequency gain to the first signal. The second gain path is configured to provide a second high frequency gain to the first signal. The second signal is generated by the transadmittance amplifier stage based on the gain recovery of the first signal and the high frequency gains of the first signal. The transimpedance amplifier stage is configured to input the second signal from the transadmittance amplifier stage and convert the second signal to an output voltage signal.

18 Claims, 6 Drawing Sheets

DUAL PATH DOUBLE ZERO CONTINUOUS TIME LINEAR EQUALIZER

TECHNICAL FIELD

The present disclosure relates generally to communications systems, and in particular, to signal compensation between a transmitter and receiver to compensate for degradation caused by lossy transmission mediums.

BACKGROUND

Maintaining signal integrity is a challenge as data rates increase and system designs get increasingly complicated with additional channels side by side. Signals travel through various interconnects inside a system to reach their destination so any electrical degradation induced between the transmitter, connectors, cabling, and printed circuit board (PCB) traces, and the receiver will affect the timing and quality of the signal.

Waveform distortions can be caused by impedance mismatches like stubs and vias, frequency dependent attenuation, and electromagnetic coupling between signal traces (i.e., crosstalk). A high speed signal moving through a channel is also subjected to high frequency impairments such as reflections, dielectric loss, and loss due to the skin effect. These impairments degrade the quality of the signal making it problematic for a receiver to interpret it correctly.

Copper backplanes do not provide adequate bandwidth to support these higher signaling rates, so to improve the quality of a link, signal conditioning devices such as equalizers have been employed.

Equalizers are devices that compensate high frequency impairments induced by a channel between a transmitter and a receiver. Equalization is a signal conditioning technique in which a waveform is manipulated either at the transmitter, at the receiver, or by a signal conditioner somewhere within a link in order to compensate for the distortions.

Transmit equalization pre-distorts a transmitted signal by amplifying the high frequency content of the signal to compensate for the expected amount of loss through the channel. The emphasized portion of the signal is attenuated by the channel resulting in an open eye, which allows the signal to be easily interpreted by the receiver.

Receive equalization compensates a signal after it travels through a channel by restoring high frequency content that was lost due to channel attenuation. One receive equalization technique may be performed by a continuous time linear equalizer (CTLE), sometimes also referred to as a gain peaking amplifier (GPA). Multi stage CTLEs are the least expensive and lowest power option for receive equalization; moreover, CTLEs do not need reference clocks. Equalization circuitry is typically implemented in application specific integrated circuits (ASICs), serializer/deserializer (SerDes) devices and similar circuits, and is typically installed on PCBs in repeaters, drivers, switches, routers, etc.

Reference is now made to FIG. 1 depicting an example application where equalization, and in particular a CTLE, can be used. A first line card 100 and a second line card 102 are coupled to a backplane 104. The first line card 100 includes an ASIC 112 and the second line card includes an ASIC 110. The ASIC 110 on line card 102 includes a transmitter for sending signals and the ASIC 112 on line card 100 includes a receiver having a CTLE. The line card 102 transmits signals to the line card 100 over copper traces on the backplane 104 through connectors 108 and 106. More specifically, the ASIC 110 on line card 102 transmits the signals over the backplane 104 to the receiver at the ASIC 112 on line card 100.

The signaling scheme used is typically one where power is spread over a frequency range. In some wireline applications (e.g., a router, a switch), modulation of digital data is typically accomplished using Non-Return to Zero (NRZ) pulse-amplitude modulation with either 2 (PAM2) or 4 (PAM4) levels. In either PAM2 or PAM4 modulation, the signal power is spread across a large frequency spectrum (from near zero Hertz to 1/Ts or higher, where Ts is the transmitted bit or symbol time duration, e.g., approximately 30-200 picoseconds).

Reference is now made to FIG. 2 depicting a schematic and corresponding block diagram of a prior art continuous time linear equalizer (CTLE) 201, several of which may be cascaded together to form a multi-stage CTLE. The prior art CTLE 201 comprises a source degenerated, transadmittance amplifier (voltage-to-current (V-I) amplifier 200) coupled to a dual gm, transimpedance amplifier (TIA) (current-to-voltage amplifier 202). A conventional current mode logic (CML) boosting stage is configured as the V-I amplifier 200 having a differential input voltage Vi applied to the gates of NMOS transistors 205 and 207. A voltage ($v_{cm}$) representative of the desired or target common-mode voltage at the output of the TIA amplifier stage 202 is generated by a separate reference or bias generator circuit (not shown), the details of which are not required for the present disclosure. The actual output common-mode voltage ($v_{sns}$) of the TIA stage 202 is sensed at the common node between resistors $Rc_p$ and $Rc_m$. Both $v_{cm}$ and $v_{sns}$ are applied to an operational transconductance amplifier (OTA) 206 which is coupled to the gates of PMOS transistors 203 and 204 forming a feedback control loop for regulating the output common-mode voltage of the TIA amplifier stage 202. Alternatively stated, voltage $v_{cm}$ is the reference voltage whereas $v_{sns}$ is the voltage feedback to the control loop. The OTA 206 compares $v_{sns}$ to $v_{cm}$ and adjusts the DC voltage applied to the gate of PMOS transistors 203 and 204 in order to make $v_{sns}$ approach $v_{cm}$.

Use of the V-I amplifier 200 results in a zero in the simplified differential voltage-to-current transfer function G(s) at a frequency fz1 (shown in FIG. 3) based on the values selected for resistor Rd and capacitor Cd which are coupled in parallel between the sources of NMOS transistors 205 and 207 and the drains of NMOS transistors 209 and 211. Transistors 209 and 211 form a current mirror along with transistor(s) located in bias generator 213. The current (iref) applied to the bias generator 213 is used to generate the gate (bias) voltages applied to transistors 209 and 211. The reference current (iref) is much smaller than the mirrored circuit currents (i11 and i9) yet the current density in the reference transistor(s), and in transistors 209 and 211, is equal. The details of the bias generator 213 are not necessary for the understanding of the present disclosure.

The simplified differential voltage-to-current transfer function G(s) of the V-I amplifier 200 can be expressed from the differential half-circuit representation as:

$$G(s) = \frac{io(s)}{Vi(s)} = \frac{gm_{nmos}(1 + sCdRd)}{\left(1 + gm_{nmos}\frac{Rd}{2}\right) + s\left(RdCd + \frac{Rd}{2}Cgs\right)}$$

where $gm_{nmos}$ is the transconductance of transistors 205 and 207 and Cgs is the gate-source capacitance of transistors 205 and 207. The half-circuit derivation is made possible by the symmetry of the circuit. The half-circuit equivalent quantities for Rd and Cd shown in FIG. 2 as connected between both excitation polarities (i.e., differentially connected) are 2*Cd and Rd/2, respectively.

PMOS transistors 203 and 204 in the V-I amplifier 200 are high impedance current mirrors that provide bias currents i3 and i4, which are substantially equal to currents i9 and i11 provided by NMOS transistors 209 and 211. NMOS transistors 205 and 207 steer the current generated by the current mirror NMOS transistors 209 and 211 between nodes nodeintp and nodeintm as a function of the applied input signal Vi. Nominally, with $V_{in}$=0V, the differential current between 205 and 207 is zero and equals that between transistors 203 and 204 (where i3–i4=0). In this case, no differential current flows into the TIA stage 202. In contrast, with a non-zero input signal (i.e., $V_{in} \neq 0$), the differential current from 205 and 207 will not equal that provided by PMOS transistors 203 and 204 (i.e., i5–i7≠0). The difference in current ($i_{in}$) is provided to the TIA amplifier stage 202. The TIA amplifier stage 202 converts the input current $i_{in}$ from the V-I amplifier 200 to an output voltage $V_{out}$ via transimpedance Rt. The transimpedance is formed by the feedback resistor Rf ($Rf_p$ and $Rf_m$) and transistors 208, 212 and 210, 214. The simplified transimpedance (Rt) derived from the differential half-circuit of the TIA stage 202 is:

$$\frac{Vout}{Iin} = R_t = \frac{1 - (gm_{nmos} + gm_{pmos})R_f}{(gm_{nmos} + gm_{pmos}) + (gds_{nmos} + gds_{pmos})}$$

where $Rf=Rf_p=Rf_m$, $gm_{nmos}$ is the transconductance of the NMOS transistors 212 and 214 and $gm_{pmos}$ is the transconductance of PMOS transistor 208 or 210. The finite output conductance of transistors 208 and 210 is represented by the terms $gds_{pmos}$, while that of transistors 212 and 214 is $gds_{nmos}$.

The TIA amplifier 202 has a low output impedance ($R_{out}$) by leveraging the transconductance (gm) of both the PMOS transistors 208, 210 and the NMOS transistors 212, 214. The differential output resistance is given by:

$$Rout_{diff} = \frac{2}{(gm_{nmos} + gm_{pmos})}$$

where $gm_{nmos}$ is the transconductance of transistors 212, 214, and $gm_{pmos}$ is the transconductance of transistors 208, 210.

Reference is now made to FIG. 3 depicting a Bode diagram of the transfer function for the prior art CTLE 201 shown in FIG. 2. The CTLE 201 depicted in FIG. 2 has a single gain path with a zero in the transfer function at frequency fz1 (set by resistor Rd and capacitor Cd) that provides increasing gain at frequencies higher than fz1. To increase the amount of compensation, many CTLEs 201 can be cascaded as depicted in FIG. 4. This increases the power consumption and amount of integrated circuit die area consumed by the CTLE. Furthermore, low frequency attenuation by the CTLE stages further necessitates the inclusion of DC gain recovery stages interposed between CTLE stages to ensure adequate overall DC gain.

Therefore, there is a need for a CTLE with higher gain peaking at substantially the same power as a traditional boosting stage so that fewer stages (thus less power and silicon area) are required for adequate compensation.

SUMMARY

According to an embodiment of the present disclosure, a continuous time linear equalizer (CTLE) is provided. The CTLE includes a transadmittance amplifier stage having first and second gain paths. The transadmittance amplifier stage is configured to input a first signal and output a second signal. The first gain path is configured to provide a DC gain recovery and a first high frequency gain to the first signal. The second gain path is configured to provide a second high frequency gain to the first signal. The second signal is generated by the transadmittance amplifier stage based on the gain recovery of the first signal and the high frequency gains of the first signal. The CTLE also includes a transimpedance amplifier stage configured to input the second signal from the transadmittance amplifier stage and convert the second signal to an output voltage signal.

According to another embodiment of the present disclosure, a method is provided. The method includes inputting a first signal at a transadmittance amplifier stage in a continuous time linear equalizer (CTLE), where the transadmittance amplifier stage has first and second gain paths. The method also includes providing a DC gain recovery and a first high frequency gain to the first signal in the first gain path and providing a second high frequency gain to the first signal in the second gain path. The method further includes generating, by the transadmittance amplifier stage, a second signal based on the gain recovery of the first signal and the high frequency gains of the first signal, and outputting the second signal. In addition, the method includes inputting, at a transimpedance amplifier stage, the second signal from the transadmittance amplifier stage, and converting the second signal to an output voltage signal.

According to yet another embodiment of the present disclosure, a system is provided. The system includes a first line card and a second line card coupled to a backplane. At least one of the first line card and the second line card comprises a continuous time linear equalizer (CTLE). The CTLE includes a transadmittance amplifier stage having first and second gain paths. The transadmittance amplifier stage is configured to input a first signal and output a second signal. The first gain path is configured to provide a DC gain recovery and a first high frequency gain to the first signal. The second gain path is configured to provide a second high frequency gain to the first signal. The second signal is generated by the transadmittance amplifier stage based on the gain recovery of the first signal and the high frequency gains of the first signal. The CTLE also includes a transimpedance amplifier stage configured to input the second signal from the transadmittance amplifier stage and convert the second signal to an output voltage signal.

Other technical features may be readily apparent to one skilled in the art from the following figures, descriptions, and claims.

BRIEF DESCRIPTION OF THE DRAWINGS

For a more complete understanding of the present disclosure, and the advantages thereof, reference is now made to the following description taken in conjunction with the accompanying drawings, wherein like numbers designate like objects, and in which.

DETAILED DESCRIPTION

The construction and practice of various embodiments are discussed in detail below. It should be appreciated, however, that the present disclosure provides many applicable inventive concepts that can be embodied in a wide variety of specific contexts. Though specific embodiments discussed herein are merely illustrative of specific ways to make and practice the teachings and technology herein, they do not limit the scope of this disclosure.

Unless defined otherwise, all technical and scientific terms used herein have the same meaning as commonly understood by those of skill in the art to which this disclosure pertains. For example, TIA is used to denote a transimpedance (i.e., current-to-voltage) amplifier. OTA is used to denote an operational transconductance amplifier having a high impedance differential input stage for receiving an input voltage and producing an output current—alternatively referred to as a voltage controlled current source (VCCS). CML is used to denote current mode logic which is a differential, point-to-point, unidirectional digital logic family intended to transmit data at high speeds across standard printed circuit boards.

Various circuits or other components may be described or claimed as "configured to" perform a task or tasks. In such contexts, "configured to" is used to connote structure by indicating that the circuits/components include structure (e.g., circuitry) that performs the task or tasks during operation. As such, the circuit/component can be said to be configured to perform the task even when the specified circuit/component is not currently operational (e.g., is not on). The circuits/components used with the "configured to" language include hardware—for example, circuits to implement the operation, etc. Reciting that a circuit/component is "configured to" perform one or more tasks is expressly intended not to invoke 35 U.S.C. 112 (f).

Reference throughout this specification to "one embodiment", "an embodiment", "a specific embodiment", or "particular embodiment" means that a particular feature, structure, or characteristic described in connection with the particular embodiment is included in at least one embodiment and not necessarily in all particular embodiments. Thus, respective appearances of the phrases "in a particular embodiment", "in an embodiment", or "in a specific embodiment" in various places throughout this specification are not necessarily referring to the same embodiment. Furthermore, the particular features, structures, or characteristics of any specific embodiment may be combined in any suitable manner with one or more other particular embodiments. It is to be understood that other variations and modifications of the particular embodiments described and illustrated herein are possible in light of the teachings herein and are to be considered as part of the spirit and scope.

Figure 1:
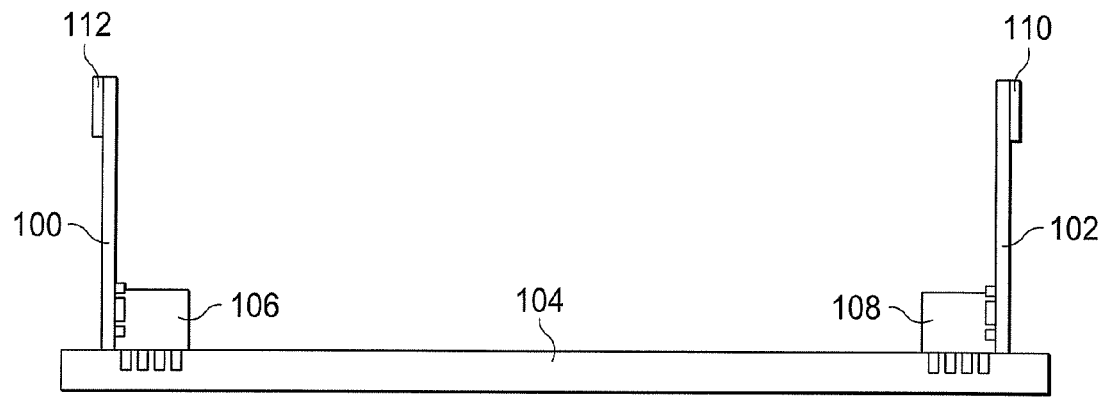
FIG. 1 depicts an example application for a continuous time linear equalizer.
Figure 3:
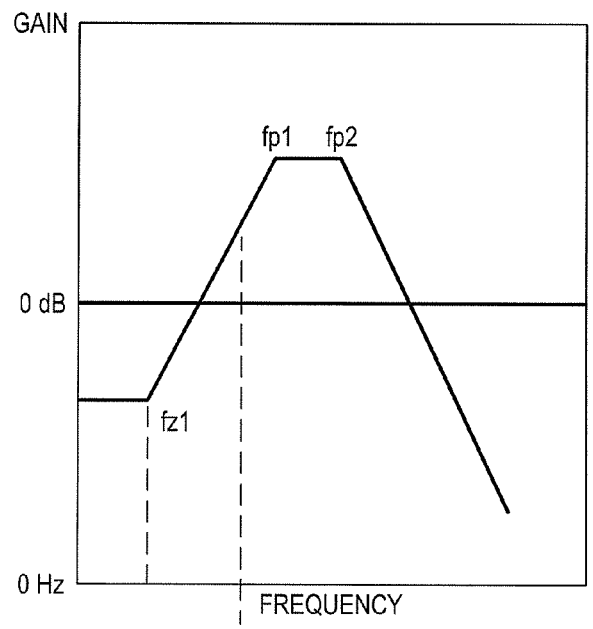
FIG. 3 is a Bode diagram of the transfer function for the prior art continuous time linear equalizer shown in FIG. 2.
Figure 4:
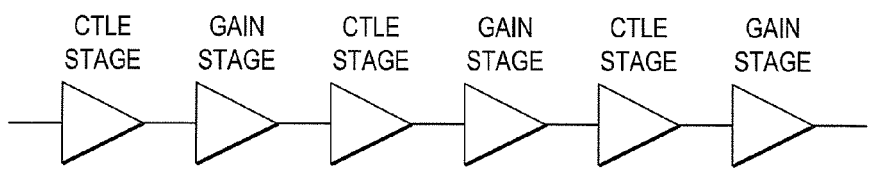
FIG. 4 is a block diagram of a multi-stage CTLE created by cascading prior art CTLEs (as shown in FIG. 2) and gain stages.
Figure 2:
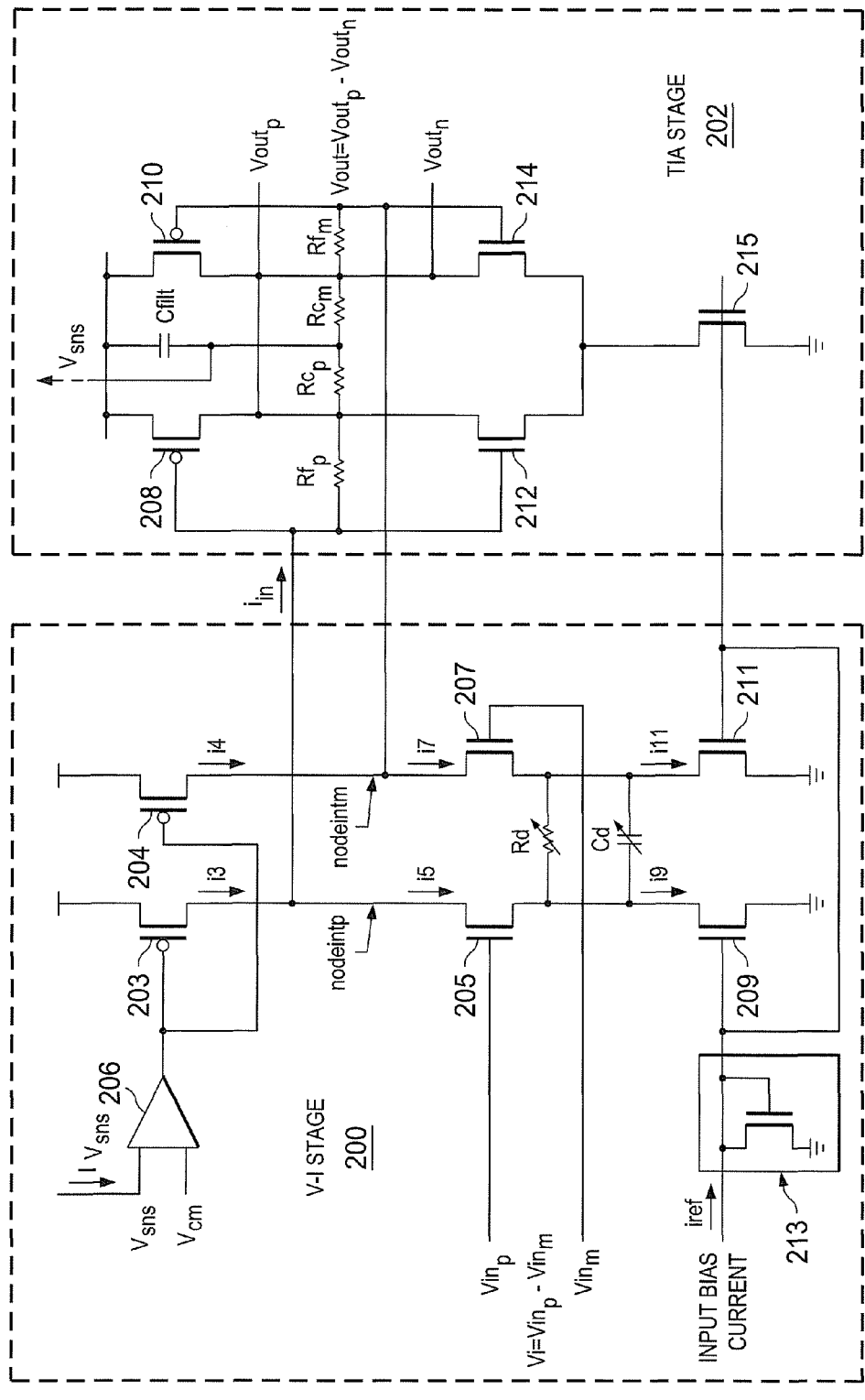
FIG. 2 is a combined schematic and block diagram of a prior art continuous time linear equalizer (CTLE)
Figure 5:
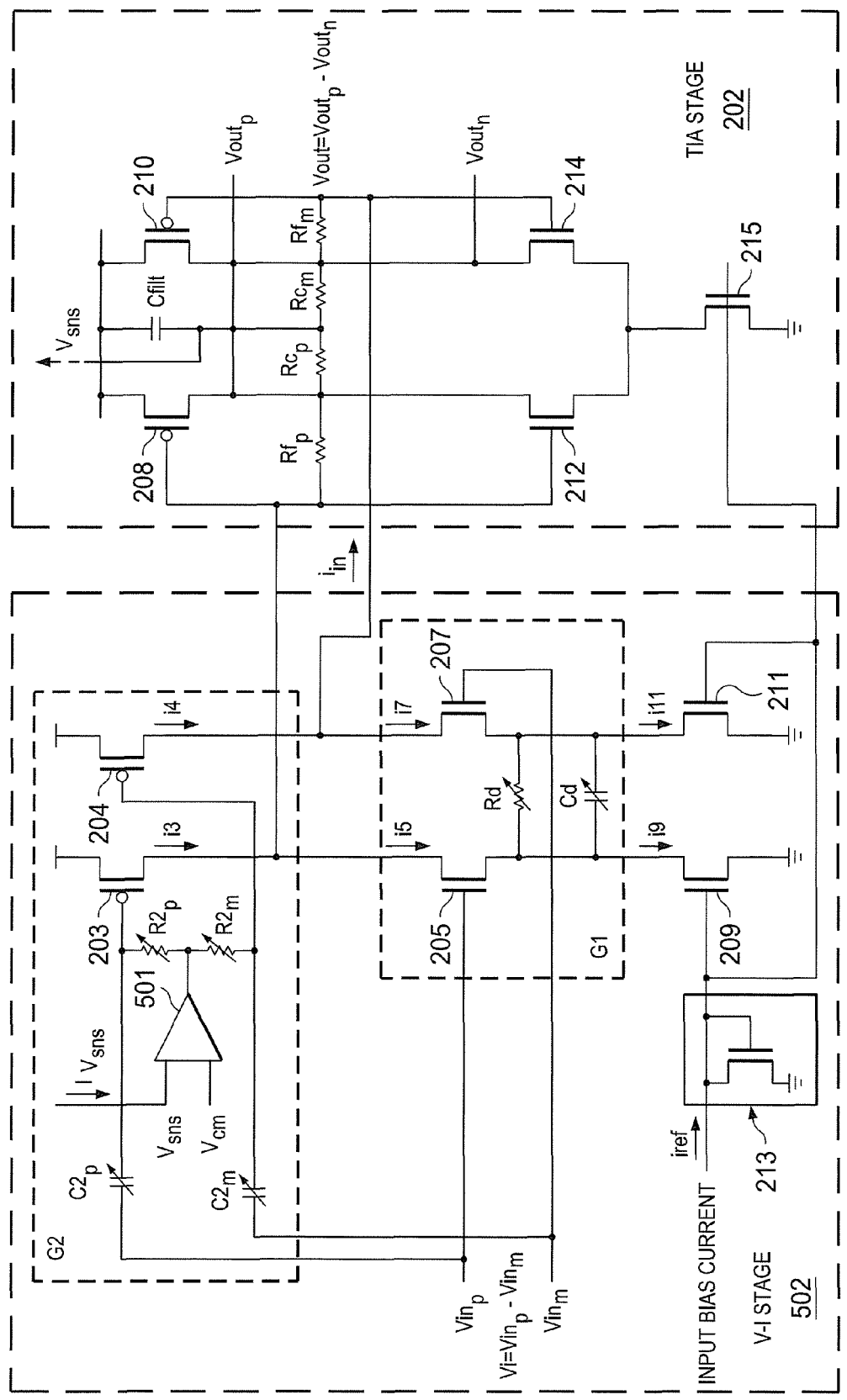
FIG. 5 is a schematic and block diagram of a dual path, double zero CTLE practiced in accordance with the principles of the present disclosure.

Turning now to FIG. 5, there is shown a schematic and corresponding block diagram of a dual path, double zero CTLE 500, practiced in accordance with the principles of the present disclosure. The dual path, double zero CTLE 500 comprises a modified source degenerated, V-I amplifier stage 502 coupled to a conventional dual gm, transimpedance amplifier (TIA) amplifier 202. The current-to-voltage stage amplifier 202 may be a conventional transimpedance amplifier as described hereinabove. Those skilled in the art will readily recognize other topologies for transimpedance amplifier stage 202 for use with the present disclosure without departing from the scope or spirit of the appended claims.

Figure 6:
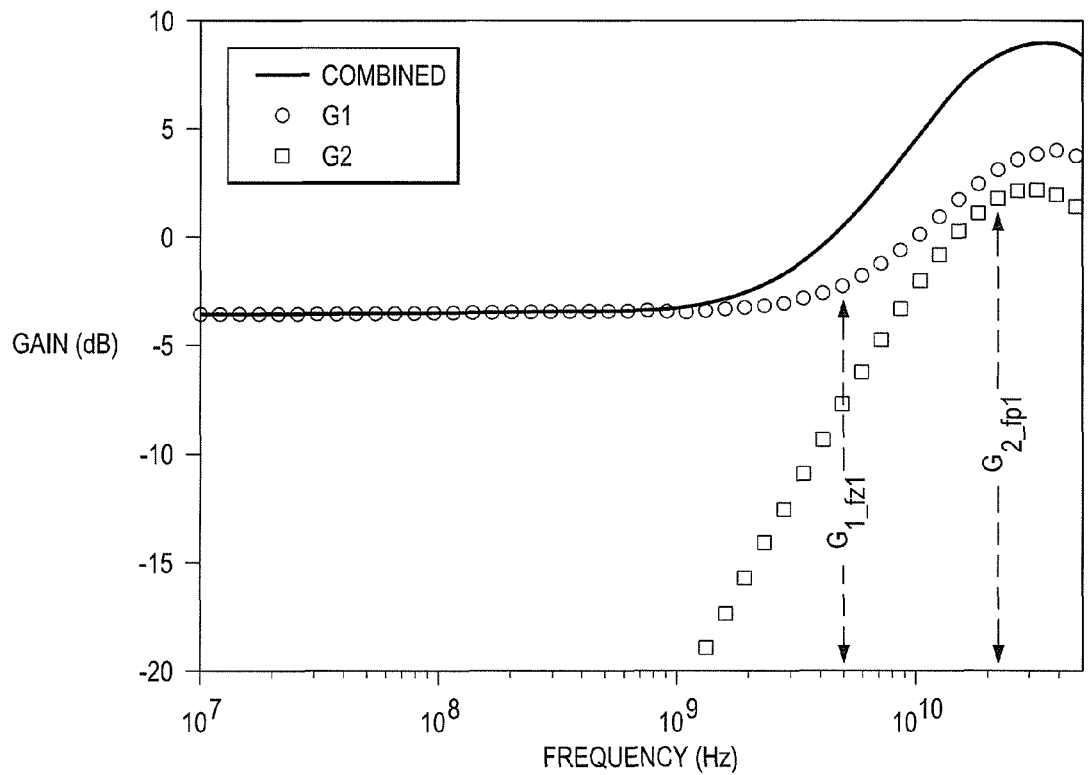
FIG. 6 is a Bode diagram illustrating the separate transfer functions for each path, as well as the combined (summed) transfer function for the dual path, double zero CTLE shown in FIG. 5.
Figure 7:
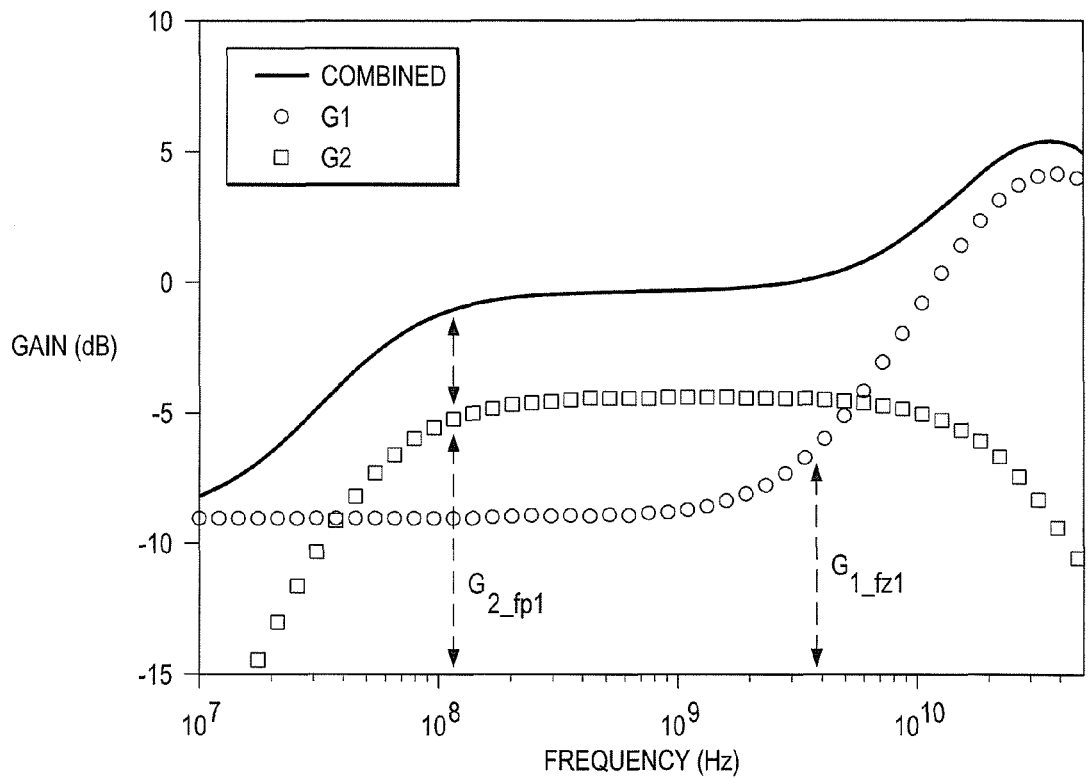
FIG. 7 is a Bode diagram illustrating an alternative gain compensation configuration for the dual path, double zero CTLE shown in FIG. 5.

The modified V-I amplifier stage 502 provides a first gain path G1 similar to the gain path described for prior art V-I stage 202 above, and also provides a second gain path G2. The second gain path G2 is provided by coupling the differential input voltage signal Vi to the gates of PMOS transistors 203 and 204 via capacitors C2 ($C2_p$ and $C2_m$). Resistors R2 ($R2_p$ and $R2_m$) are coupled between the output of OTA 501 and the gates of PMOS transistors 203 and 204 to provide a common DC operating point on transistors 203 and 204. The values of resistors R2, in combination with capacitors C2, result in a pole in the transfer function of path G2 at a frequency $G_{2\_fp1}$, as shown in FIGS. 6 and 7 (described in greater detail below). R2 and C2 can be programmable to adjust the gain of path G2 of V-I stage 502.

The transfer function representing the additional path G2 from input voltage Vi has a zero at zero hertz frequency, and a pole located at frequency $G_{2\_fp1}$ set by 1/(R2*C2). The high-pass filter formed by C2 and R2 in gain path G2 allows the input signal to pass onto transistors 203 and 204 with decreasing attenuation as frequency increases (at a rate of 20 dB/decade) until reaching the pole frequency $G_{2\_fp1}$ set by 1/(R2*C2), at which point the transfer function flattens. R2 and C2 are used to control the amount of gain peaking provided by path G2. The signal transmitted though the high pass filter formed by R2 and C2 is applied to the gates of PMOS transistors 203 and 204. The PMOS transistors 203 and 204 amplify the signal providing additional high frequency gain.

It should be noted that in the topology of modified V-I amplifier stage 502, transistors 203 and 204 have a dual purpose. The transistors 203 and 204 provide high-output impedance current mirrors to path G1 (as in the prior art) and further provide amplification in path G2. Since the transistors 203 and 204 are already present, an expense for additional transistors to provide amplification in path G2 is avoided.

A simplified transfer function of G2, derived from the differential half-circuit, may be expressed as follows:

$$G2(s) = \frac{iin(s)}{Vi(s)} = \frac{gm_{pmos}(sC2R2)}{(1+sC2R2)}$$

where $gm_{pmos}$ is the transconductance of PMOS transistors 203 and 204 and iin(s) is the net input current into TIA stage 202.

As described above, the gain path G1 is configured to provide high-frequency gain peaking to the input voltage Vi.

The gain path G2 is configured to provide an additional high frequency gain to the input voltage Vi. Thus, both gain paths can provide high frequency boost. The added boost capacity that is achieved due to the gain path G2 is one benefit of the CTLE 500. Here total boost is greatly improved without consuming more current or die area, as compared to other CTLE architectures. In some embodiments, it is possible to configure gain path G1 to apply equal and positive DC gain across all operating frequencies. In such embodiments, gain path G1 does not boost high frequencies. Instead, gain path G1 provides positive DC gain across all frequencies, while gain path G2 provides the high frequency boosting.

The particular embodiment described for the V-I stage 502 in FIG. 5 is illustrated with NMOS input transistors 205 and 207 and PMOS current mirror transistors 203 and 204 acting as G2 path amplifiers. Those skilled in the art will readily recognize that the V-I stage 502 can be implemented such that transistors 205 and 207 are PMOS transistors and transistors 203 and 204 are NMOS transistors, without departing from the scope of the present disclosure.

In some embodiments, the resistors, capacitors, and transistor components are fabricated on the same integrated circuit die, allowing changes in values due to process and temperature variations to be tracked together.

Reference is now made to FIGS. 6 and 7, illustrating separate first and second transfer functions G1 and G2 for the dual path, double zero CTLE shown in FIG. 5. In the illustrated transfer function, gain path G1 has a zero at frequency $G_{1\_fz1}$ set by resistor Rd and capacitor Cd (as described herein above) providing increasing gain at higher frequencies beyond $G_{1\_fz1}$. A first pole at frequency $G_{1\_fp1}$ arises as a result of components Rd, Cd and the transconductance and capacitance of transistors 205 and 207. From the differential half-circuit, it can be shown that the pole $G_{1\_fp1}$ is located at:

$$G_{1\_fp1} = \frac{1 + gm_{nmos}\left(\frac{Rd}{2}\right)}{(Rd/2)(2Cd + Cgs)}$$

where $gm_{nmos}$ and Cgs are the transconductance and gate-source capacitance of transistors 205 and 207, shown in FIG. 5. Gain path G2 has a zero at zero hertz frequency due to capacitors C2, and a pole at frequency $G_{2\_fp1}$ set by $1/(R2*C2)$.

Except for components Rd and Cd, the circuitry used and components selected in FIG. 5 to implement the transfer functions (e.g., pole/zero locations) are illustrated as single-ended, half-circuit equivalents of differential circuitry implementations. The half-circuit notation is used for convenience and easy referencing to individual components. Those skilled in the art will easily recognize how to substitute the differential circuitry/component selection for the half-circuit/notation without departing from the scope or spirit of the present disclosure. For example, in the differential case, half-circuit notation Cp=Cm=C, Rp=Rm=R would be replaced with Cdiff=C/2 and Rdiff=2R.

Figure 8:
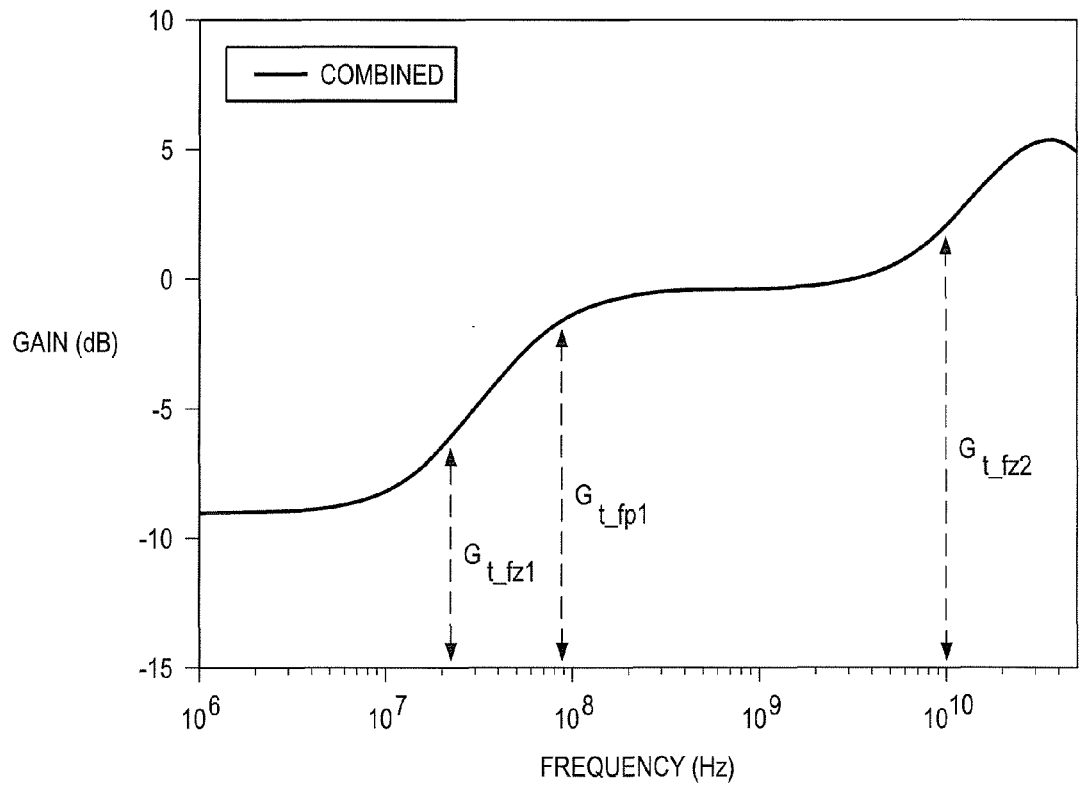
FIG. 8 is a bode diagram illustrating the pole and zero locations of a single gain compensation configuration from the combined transfer function, of the dual path, double zero CTLE shown in FIG. 5.

FIGS. 6, 7, and 8 additionally illustrate the combined (summed) transfer function of G1 and G2 for the dual path, double zero CTLE shown in FIG. 5. Summation of both pathways G1 and G2 (each with its own zero) results in a single zero transfer function if $(G_{2\_fp1} > G_{1\_fz1})$ as illustrated in FIG. 6, or can result into two separated zeros if $(G_{2\_fp1} < G_{1\_fz1})$ as illustrated in FIGS. 7 and 8. In either scenario, additional high frequency gain (boost) is provided by path G2. The gain provided by G2 can be configured to enhance the mid-frequencies (FIG. 7-8), or further enhance the same frequency range enhanced by G1 (FIG. 6). Control of the gain on G2 is achieved through adjusting the values of R2, C2, and $gm_{pmos}$ of transistors 203 and 204 (FIG. 5).

Notably, mid-range frequencies can be actively boosted in path G2 (see FIG. 7). This is an attribute of the topology presented in FIG. 5 that previously was obtained by additional passive mid-frequency boosting circuits that further attenuated the input signal. The path G2 described herein does not significantly attenuate the input signal, and can work in tandem with mid-frequency boosting provided in the degeneration network of path G1. This further enhances total mid-frequency equalization.

Figure 9:
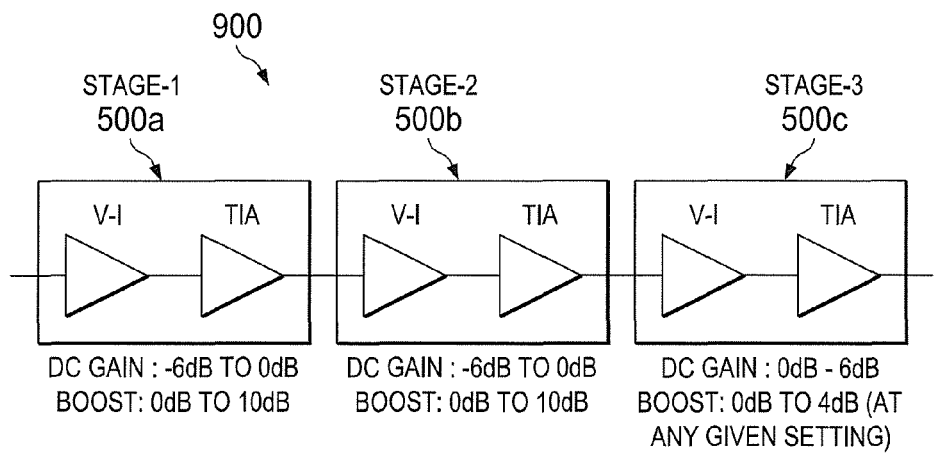
FIG. 9 is a block diagram of the boost and gain stages for implementing a multi-stage CTLE employing cascaded CTLEs shown in FIG. 5.

FIG. 9 illustrates a block diagram of an example multi-stage CTLE 900 employing cascaded CTLEs 500*a*-500*c*, each representing a CTLE such as the CTLE 500 in FIG. 5. A higher amount of frequency boost achieved per stage results in fewer stages being cascaded to achieve a boost specification. The term "boost" is used throughout the present disclosure in its ordinary meaning to denote increasing gain with increasing frequency.

The CTLE 500 can both provide DC gain recovery (via path G1) and enhance high frequencies (via path G2). In this case, path G1 does not attenuate DC. The degeneration resistor Rd in path G1 can be set to ensure positive DC gain is created. The CTLE 500 can thus provide DC gain recovery while still yielding high frequency boost from path G2. Gain stages implemented using the CTLE 500 shown in FIG. 5 and configured for positive DC gain (as described hereinabove) further reduce the number of stages required in a cascade.

Modern integrated circuit design and manufacturing are commonly automated with Electronic Design Automation (EDA) tools. Example tools may be found from companies such as, but not limited to, Synopsys, Cadence, and Mentor Graphics. The details of these EDA tools are not required for the present disclosure.

Figure 10:
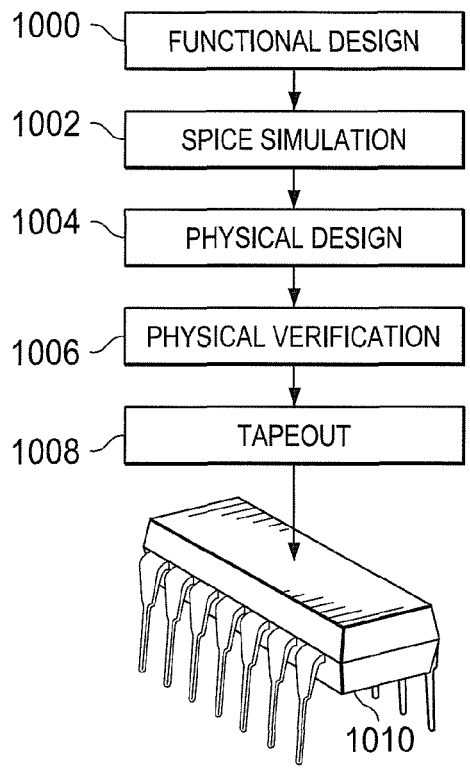
FIG. 10 is a flow diagram for an example design flow for design and manufacture of a dual path, double zero CTLE shown in FIG. 5.

Reference is now made to FIG. 10 illustrating a simplified general ASIC design flow employing (EDA) tools for producing ASICs having embodiments of the present disclosure. At step 1000, the functional design of an ASIC which may include CTLE stages in accordance with principles of the present disclosure is created.

For the digital portions of the ASIC, the functional design is typically established by writing Register Transfer Level (RTL) code in a Hardware Descriptive Language (HDL) such as, but not limited to, VHDL or Verilog. A functional verification (behavioral simulation) is then performed on the HDL data structures to ensure the RTL design is in accordance with the logic specifications. Alternatively, a schematic of the digital logic can be captured with a schematic capture program.

For the analog portions of the ASIC, such as the CTLE stages of the present disclosure, the analog functional design is typically established by capturing a schematic with a schematic capture program. The output of the schematic capture program is then converted (synthesized) into gate/transistor level netlist data structures.

At step 1002, the data structures are simulated with a simulation program with integrated circuits emphasis (SPICE). At step 1004, the data structures from step 1002 are instantiated with their geometric representations and the physical layout of the ASIC is generated.

The first step in physical layout is typically so-called "floor-planning", wherein gross regions on the integrated circuit chip are assigned and input/output (I/O) pins are defined. Hard cores (e.g. arrays, analog blocks, etc.) are placed within the gross regions based on the design constraints (e.g. trace lengths, timing etc.). Clock wiring (commonly referred to as clock trees) is placed and connections between gates/analog blocks are routed. When all of the elements are placed, a global and detailed routing is performed to connect all the elements together. Postwiring optimization is preferably performed to improve performance (timing closure), noise (signal integrity), and yield. The layout is modified, where possible, while maintaining compliance with the design rules set by the captive or external semiconductor manufacturing foundry of choice, to make the chip more efficient to produce. Such modifications may include adding extra vias or dummy metal/diffusion/poly layers.

At step 1006, the physical design is verified. Design rule checking (DRC) is performed to determine whether the physical layout of the ASIC satisfies a series of recommended parameters, e.g., the design rules of the foundry. The design rules are a series of parameters provided by the foundry that are specific to a particular semiconductor manufacturing process. The design rules specify certain geometric and connectivity restrictions to ensure sufficient margins to account for variability in semiconductor manufacturing processes, to ensure that the ASICs work correctly. A layout versus schematic (LVS) check is preferably performed to verify the physical layout corresponds to the original schematic or circuit diagram of the design. A complete simulation can then be performed to ensure the layout phase is properly completed.

After the layout is verified in step 1006, mask generation design data, typically in the foam of GDSII data structures, is said to "tapeout" for preparation of photomasks at step 1008. The GDSII data structures are transferred through a communications medium (e.g., storage or over a network) from the circuit designer to either a photomask supplier/maker or directly to the semiconductor foundry.

At step 1010, the photomasks are created and used to manufacture ASICs in accordance with principles of the present disclosure.

Some of the techniques described herein can be implemented by software stored on one or more computer readable storage medium and executed on a computer. The selected techniques could be executed on a single computer or a computer networked with another computer or computers. For clarity, only those aspects of the tools or computer germane to the disclosed techniques are described. Product details well known in the art may be omitted.

Figure 11:
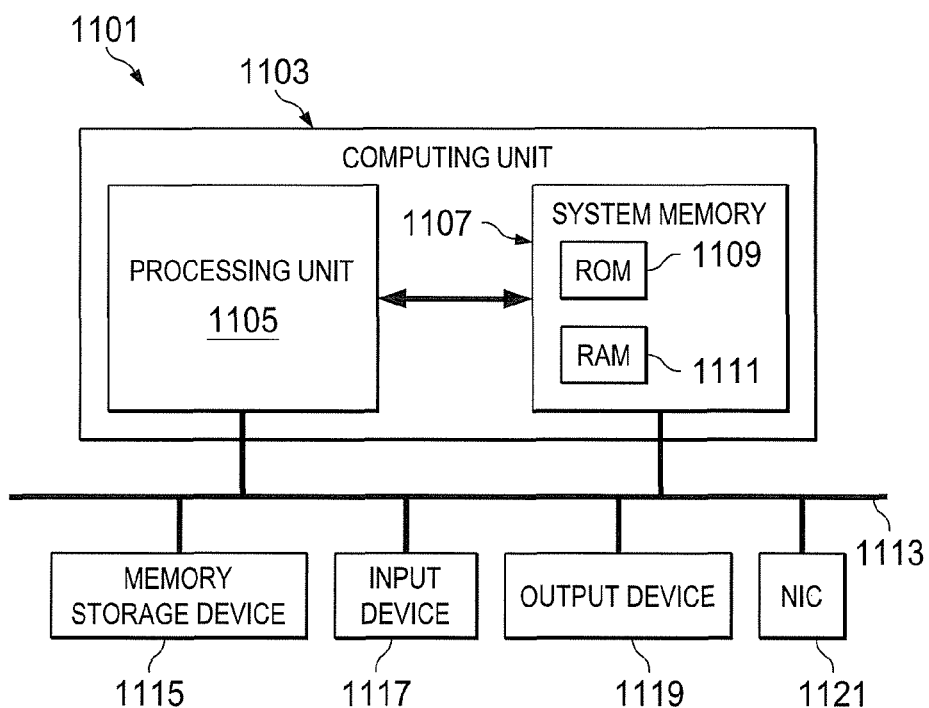
FIG. 11 is an example computing system for practicing the design flow depicted in FIG. 10.

FIG. 11 shows an example of a computing device 1101 for practicing the design flow of FIG. 10. As seen in FIG. 11, the computing device 1101 includes a computing unit 1103 with a processing unit 1105 and a system memory 1107. The processing unit 1105 may be any type of programmable electronic device for executing software instructions, but will conventionally be a microprocessor. The system memory 1107 may include both a read-only memory (ROM) 1109 and a random access memory (RAM) 1111. As will be appreciated by those of ordinary skill in the art, both the read-only memory 1109 and the random access memory 1111 may store software instructions for execution by the processing unit 1105.

The processing unit 1105 and the system memory 1107 are connected, either directly or indirectly, through a bus 1113 or alternate communication structure, to one or more peripheral devices. For example, the processing unit 1105 or the system memory 1107 may be directly or indirectly connected to one or more additional memory storage devices 1115. The memory storage devices 1115 may include, for example, a "hard" magnetic disk drive, a solid state disk drive, an optical disk drive, and a removable disk drive. The processing unit 1105 and the system memory 1107 also may be directly or indirectly connected to one or more input devices 1117 and one or more output devices 1119. The input devices 1117 may include, for example, a keyboard, a pointing device (such as a mouse, touchpad, stylus, trackball, or joystick), a scanner, a camera, and a microphone. The output devices 1119 may include, for example, a display device, a printer and speakers. With various examples of the computing device 1101, one or more of the peripheral devices 1115-1119 may be internally housed with the computing unit 1103. Alternately, one or more of the peripheral devices 1115-1119 may be external to the housing for the computing unit 1103 and connected to the bus 1113 through, for example, a Universal Serial Bus (USB) connection or a digital visual interface (DVI) connection.

With some implementations, the computing unit 1103 may also be directly or indirectly connected to one or more network interfaces cards (NIC) 1121, for communicating with other devices making up a network. The network interface cards 1121 translate data and control signals from the computing unit 1103 into network messages according to one or more communication protocols, such as the transmission control protocol (TCP) and the Internet protocol (IP). Also, the network interface cards 1121 may employ any suitable connection agent (or combination of agents) for connecting to a network, including, for example, a wireless transceiver, a modem, or an Ethernet connection.

It should be appreciated that the computing device 1101 is illustrated as an example only, and it not intended to be limiting. Various embodiments may be implemented using one or more computing devices that include the components of the computing device 1101 illustrated in FIG. 11, or which include an alternate combination of components, including components that are not shown in FIG. 11. For example, various embodiments may be implemented using a multi-processor computer, a plurality of single and/or multiprocessor computers arranged into a network, or some combination of both.

Although features and elements are described above in particular combinations, each feature or element can be used alone without the other features and elements or in various combinations with or without other features and elements. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A continuous time linear equalizer (CTLE) comprising:
   a transadmittance amplifier stage having first and second gain paths and configured to input a first signal and output a second signal, the first gain path configured to provide a DC gain recovery and a first high frequency gain to the first signal and the second gain path configured to provide a second high frequency gain to the first signal, the second signal generated by the transadmittance amplifier stage based on the DC gain recovery of the first signal and the first and second high frequency gains of the first signal, wherein the second gain path comprises:
   a first capacitor disposed between an input of the first signal and a gate of a first transistor in the transadmittance amplifier stage;
   a second capacitor disposed between the input of the first signal and a gate of a second transistor in the transadmittance amplifier stage; and first and second resistors coupled between the gates of the first and second transistors, the first and second resistors further coupled to an output of an operational transconductance amplifier within the transadmittance amplifier stage; and a transimpedance amplifier stage configured to input the second signal from the transadmittance amplifier stage and convert the second signal to an output voltage signal.

2. The CTLE of claim 1, wherein the first and second capacitors and the first and second resistors are configured to be programmed to adjust the second high frequency gain provided by the second gain path.

3. The CTLE of claim 1, wherein the operational transconductance amplifier further comprises:
a first input coupled to a target common mode voltage for the output voltage signal of the transimpedance amplifier stage; and
a second input coupled to an actual common mode voltage sensed in the transimpedance amplifier stage.

4. The CTLE of claim 1, wherein the first gain path further comprises:
a third transistor having a gate coupled to the input of the first signal, and a first source/drain coupled to an output of the second signal; and
a fourth transistor having a gate coupled to the input of the first signal, and a first source/drain coupled to the output of the second signal.

5. The CTLE of claim 4, further comprising a third resistor and a third capacitor, each coupled between a second source/drain of the third transistor and a second source/drain of the fourth transistor.

6. The CTLE of claim 4, further comprising a current mirror coupled to a second source/drain of the third transistor and a second source/drain of the fourth transistor.

7. A method comprising:
inputting a first signal at a transadmittance amplifier stage in a continuous time linear equalizer (CTLE), the transadmittance amplifier stage having first and second gain paths, wherein the second gain path comprises:
a first capacitor disposed between an input of the first signal and a gate of a first transistor in the transadmittance amplifier stage;
a second capacitor disposed between the input of the first signal and a gate of a second transistor in the transadmittance amplifier stage; and
first and second resistors coupled between the gates of the first and second transistors, the first and second resistors further coupled to an output of an operational transconductance amplifier within the transadmittance amplifier stage;
applying a DC gain recovery and a first high frequency gain to the first signal in the first gain path;
applying a second high frequency gain to the first signal in the second gain path;
generating, by the transadmittance amplifier stage, a second signal based on the DC gain recovery of the first signal and the first and second high frequency gains of the first signal, and outputting the second signal; and
inputting, at a transimpedance amplifier stage, the second signal from the transadmittance amplifier stage, and converting the second signal to an output voltage signal.

8. The method of claim 7, further comprising:
adjusting a setting of at least one of the first capacitor, the second capacitor, the first resistor, or the second resistor to adjust the second high frequency gain provided by the second gain path.

9. The method of claim 7, wherein the operational transconductance amplifier further comprises:
a first input coupled to a target common mode voltage for the output voltage signal of the transimpedance amplifier stage; and
a second input coupled to an actual common mode voltage sensed in the transimpedance amplifier stage.

10. The method of claim 7, wherein the first gain path further comprises:
a third transistor having a gate coupled to the input of the first signal, and a first source/drain coupled to an output of the second signal; and
a fourth transistor having a gate coupled to the input of the first signal, and a first source/drain coupled to the output of the second signal.

11. The method of claim 10, further comprising a third resistor and a third capacitor, each coupled between a second source/drain of the third transistor and a second source/drain of the fourth transistor.

12. The method of claim 10, further comprising a current mirror coupled to a second source/drain of the third transistor and a second source/drain of the fourth transistor.

13. A system comprising:
a first line card and a second line card coupled to a backplane, wherein at least one of the first line card and the second line card comprises a continuous time linear equalizer (CTLE), the CTLE comprising:
a transadmittance amplifier stage having first and second gain paths and configured to input a first signal and output a second signal, the first gain path configured to provide a DC gain recovery and a first high frequency gain to the first signal and the second gain path configured to provide a second high frequency gain to the first signal, the second signal generated by the transadmittance amplifier stage based on the DC gain recovery of the first signal and the first and second high frequency gains of the first signal, wherein the second gain path comprises:
a first capacitor disposed between an input of the first signal and a gate of a first transistor in the transadmittance amplifier stage;
a second capacitor disposed between the input of the first signal and a gate of a second transistor in the transadmittance amplifier stage; and
first and second resistors coupled between the gates of the first and second transistors, the first and second resistors further coupled to an output of an operational transconductance amplifier within the transadmittance amplifier stage; and
a transimpedance amplifier stage configured to input the second signal from the transadmittance amplifier stage and convert the second signal to an output voltage signal.

14. The system of claim 13, wherein the first and second capacitors and the first and second resistors are configured to be programmed to adjust the second high frequency gain provided by the second gain path.

15. The system of claim 13, wherein the operational transconductance amplifier further comprises:
a first input coupled to a target common mode voltage for the output voltage signal of the transimpedance amplifier stage; and
a second input coupled to an actual common mode voltage sensed in the transimpedance amplifier stage.

16. The system of claim 13, wherein the first gain path further comprises:
a third transistor having a gate coupled to the input of the first signal, and a first source/drain coupled to an output of the second signal; and a fourth transistor having a gate coupled to the input of the first signal, and a first source/drain coupled to the output of the second signal.

17. The system of claim 16, further comprising a third resistor and a third capacitor, each coupled between a second source/drain of the third transistor and a second source/drain of the fourth transistor.

18. The system of claim 16, further comprising a current mirror coupled to a second source/drain of the third transistor and a second source/drain of the fourth transistor.

* * * * *